United States Patent
Hurwitz (10) Patent No.: US 9,620,617 B2
(45) Date of Patent: Apr. 11, 2017

(54) STRUCTURE AND METHOD FOR REDUCING SUBSTRATE PARASITICS IN SEMICONDUCTOR ON INSULATOR TECHNOLOGY

(71) Applicant: Newport Fab, LLC, Newport Beach, CA (US)

(72) Inventor: Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/827,183

(22) Filed: Aug. 14, 2015

(65) Prior Publication Data

US 2016/0071927 A1    Mar. 10, 2016

Related U.S. Application Data

(60) Provisional application No. 62/045,778, filed on Sep. 4, 2014.

(51) Int. Cl.

| | |
|---|---|
| *H01L 21/762* | (2006.01) |
| *H01L 29/06* | (2006.01) |
| *H01L 27/12* | (2006.01) |
| *H01L 29/66* | (2006.01) |
| *H01L 21/84* | (2006.01) |
| *H01L 29/78* | (2006.01) |
| *H01L 29/786* | (2006.01) |

(52) U.S. Cl.
CPC .. *H01L 29/66477* (2013.01); *H01L 21/76283* (2013.01); *H01L 21/84* (2013.01); *H01L 27/1203* (2013.01); *H01L 29/78* (2013.01); *H01L 29/786* (2013.01)

(58) Field of Classification Search
CPC ...... H01L 27/1203–27/1211; H01L 29/66477; H01L 29/78; H01L 29/786; H01L 21/76283; H01L 21/84
See application file for complete search history.

(56) References Cited

U.S. PATENT DOCUMENTS

| | | | |
|---|---|---|---|
| 6,780,686 B2 * | 8/2004 | Wei | H01L 29/66772 257/E21.415 |
| 7,927,963 B2 | 4/2011 | Brown | |
| 8,089,126 B2 * | 1/2012 | Botula | H01L 21/26506 257/347 |

(Continued)

*Primary Examiner* — Eric Ward
(74) *Attorney, Agent, or Firm* — Bever, Hoffman & Harms, LLP (57) ABSTRACT

A structure having improved electrical signal isolation and linearity is disclosed. The structure includes a buried oxide ("BOX") layer over a bulk semiconductor layer, a device layer over the buried oxide layer, a compensation implant region near an interface of the buried oxide layer and the bulk semiconductor layer, wherein the compensation implant region is configured to substantially eliminate a parasitic conduction layer near the buried oxide layer. The compensation implant region has a doping concentration of at least one order of magnitude higher than a doping concentration of the bulk semiconductor layer. The structure includes a deep trench extending through the device layer and the buried oxide layer, and a damaged implant region in the bulk semiconductor layer near the deep trench. The structure also includes at least one transistor in the device layer.

17 Claims, 10 Drawing Sheets

(56) References Cited

U.S. PATENT DOCUMENTS

| | | | | |
|---|---|---|---|---|
| 8,093,115 B2* | 1/2012 | Schwartz | H01L 21/84 | |
| | | | 257/E21.32 | |
| 8,131,225 B2* | 3/2012 | Botula | H01L 27/1203 | |
| | | | 257/349 | |
| 8,134,224 B2* | 3/2012 | Sagae | H01L 21/76264 | |
| | | | 257/607 | |
| 8,471,340 B2* | 6/2013 | Botula | H01L 21/2652 | |
| | | | 257/104 | |
| 8,492,868 B2* | 7/2013 | Botula | H01L 21/76283 | |
| | | | 257/501 | |
| 8,828,746 B2* | 9/2014 | Botula | H01L 22/14 | |
| | | | 438/11 | |
| 2010/0052053 A1* | 3/2010 | Barth, Jr. | H01L 29/78615 | |
| | | | 257/347 | |
| 2012/0038024 A1* | 2/2012 | Botula | H01L 21/76289 | |
| | | | 257/510 | |
| 2012/0313173 A1* | 12/2012 | Dickey | H01L 27/1203 | |
| | | | 257/347 | |
| 2013/0009725 A1* | 1/2013 | Heaney | H01L 21/84 | |
| | | | 333/103 | |
| 2013/0181290 A1* | 7/2013 | Hurwitz | H01L 21/7624 | |
| | | | 257/347 | |
| 2013/0181321 A1* | 7/2013 | Hurwitz | H01L 21/76237 | |
| | | | 257/506 | |

* cited by examiner

STRUCTURE AND METHOD FOR REDUCING SUBSTRATE PARASITICS IN SEMICONDUCTOR ON INSULATOR TECHNOLOGY

BACKGROUND

The present application claims the benefit of and priority to a provisional patent application entitled "Method and Structure for Reducing Substrate Parasitics in Silicon-On-Insulator Technologies," U.S. Ser. No. 62/045,778 filed on Sep. 4, 2014. The disclosure in this provisional application is hereby incorporated fully by reference into the present application.

Radio frequency ("RF") circuits made by fabricating semiconductor devices, such as transistors, on a semiconductor on insulator ("SOI") wafer typically suffer from several drawbacks, due to losses associated with substrate impedance. For example, unwanted crosstalk between devices or circuit blocks can occur through the substrate. Moreover, in RF switches built in SOI technologies, the parasitic substrate impedance can result in degraded linearity and voltage imbalance across large branches of stacked semiconductor devices.

Some of the effects experienced by the monolithic RF circuits when utilizing SOI wafers can be partially mitigated by using SOI wafers having a high resistivity substrate. For example, RF switches built on a SOI wafer can use a high resistivity substrate under buried oxide and device layers. Typically, the buried oxide layer in contact with the high resistivity substrate contains positive bulk charge. In addition, fixed charge (e.g., positive charge) is also present at the interface of the high resistivity substrate and the buried oxide layer, for example, thermally grown on the high resistivity substrate. Due to the low background doping of the high resistivity substrate, the positive charge can cause an accumulation of mobile charges of opposite polarity (e.g., negative charge) under the buried oxide layer, resulting in the formation of a parasitic conduction layer (PCL) of high mobility carriers in the high resistivity substrate, which can significantly decrease the effective resistivity of the substrate. For example, if 1000 ohm-cm silicon is used to build a high resistivity substrate, the effective resistivity of the substrate is found to be only approximately one fifth of that value (i.e., 200 ohm-cm) based on transmission line measurements over the substrate.

To address the PCL associated with the high resistivity SOI wafer, a conventional approach is to deposit a defect-rich layer on the high resistivity substrate such that the inversion charge is in a region of low mobility. Although this conventional approach can increase the effective substrate resistivity, due to increased manufacturing complexity, it costs significantly more than the standard high resistivity SOI without the defect-rich layer. According to another conventional approach, a damaged region can be formed in the high resistivity substrate as part of an integrated circuit manufacturing flow, where an amorphizing implant (e.g., argon or germanium) having a high density of carriers is introduced to reduce carrier mobility in the high resistivity substrate. However, the damaged region can re-align to the underlying substrate at temperatures far below what is typically required for CMOS manufacturing (e.g., at 550° C.). As a result, the formation of the damaged regions must happen after the formation of the active devices (e.g., after the source/drain anneal in the CMOS or BiCMOS process flow). Also, such a heavy dose of damaging implant must be done outside of the active device regions to avoid damaging the active devices, which seriously compromises the effectiveness of this approach in applications where large devices are required (e.g., low loss RF switches).

Not only does the PCL under an active device region lower the effective substrate impedance, but because the PCL under the active device region is isolated by the surrounding damaged regions, potential swings in the active device region in the device layer can modulate a depletion region depth in the high resistivity substrate. As a consequence, the depletion regions act as a dielectric medium to form one or more voltage-dependent, non-linear capacitors, such as parasitic varactors, in the high resistivity substrate. These parasitic varactors can contribute to the non-linearity in signals propagating through the device layer, for example, through the source and drain regions of RF switches (e.g., field effect transistors).

Thus, there is a need in the art for a semiconductor on insulator (SOI) structure having improved electrical signal isolation and linearity.

SUMMARY

The present disclosure is directed to structure and method for reducing substrate parasitics in semiconductor on insulator (SOI) technology, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
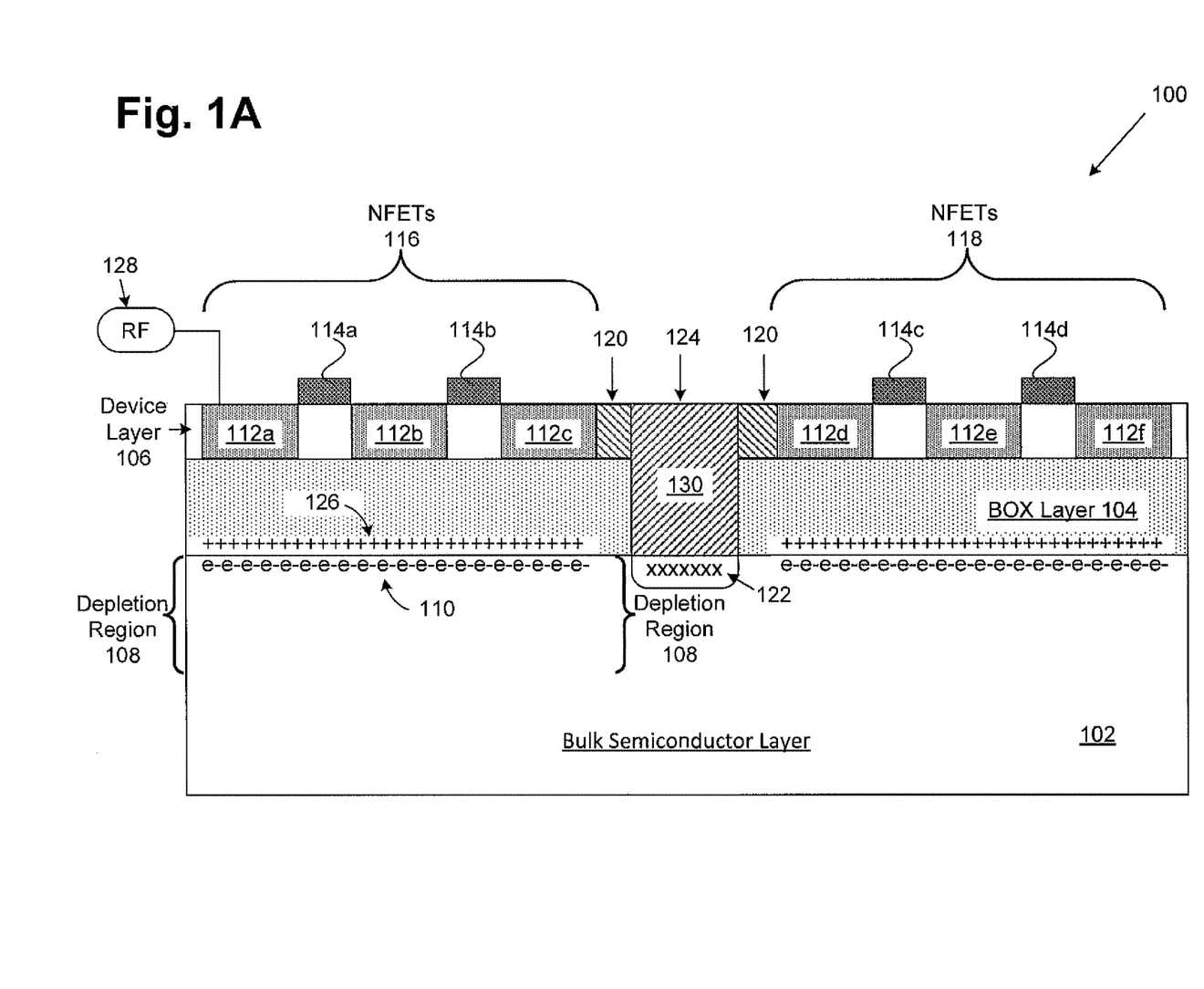
FIG. 1A illustrates a cross-sectional view of a conventional semiconductor on insulator ("SOI") structure.

FIG. 1A illustrates a cross-sectional view of a conventional SOI structure. Structure 100 includes bulk semiconductor layer 102, buried oxide ("BOX") layer 104 and device layer 106. Structure 100 also includes N-channel field effect transistors ("NFETs") 116 and 118 fabricated in device layer 106, and are electrically isolated from each other by shallow trench 120, deep trench 124 and buried oxide layer 104, for example. As illustrated in FIG. 1A, bulk semiconductor layer 102 is situated below buried oxide layer 104, and may be part of a handle wafer. Buried oxide layer 104 is situated over bulk semiconductor layer 102, and includes an insulator material such as an insulative oxide. Device layer 106 is situated over buried oxide layer 104, and includes semiconductor material such as silicon.

As illustrated in FIG. 1A, NFETs 116 include source/drain regions 112a, 112b and 112c, and gate structures 114a and 114b. Similarly, NFETs 118 include source/drain regions 112d, 112e and 112f, and gate structures 114c and 114d. NFETs 116 and 118 may be surrounded by deep trenches and damaged regions, such as deep trench 124 and damaged implant region 122. As illustrated in FIG. 1A, shallow trench 120 extends into device layer 106. Shallow trench 120 is filled with dielectric material such as an insulative oxide. Deep trench 124 extends through device layer 106 and into buried oxide layer 104. Deep trench 124 is filled with dielectric material 130. Damaged implant region 122 is formed under deep trench 124.

As illustrated in FIG. 1A, in response to potential 128, such as an RF potential, applied to one or more semiconductor devices in device layer 106, fixed charge 126, (e.g., positive charge) in buried oxide layer 104 can cause an accumulation of mobile charge of opposite polarity (e.g., negative charge) under buried oxide layer 104, resulting in a formation of parasitic conduction layer 110, which lowers the effective substrate impedance of bulk semiconductor layer 102 situated below buried oxide layer 104. As illustrated in FIG. 1 A, the negative charge under buried oxide layer 104 is surrounded by deep trenches (e.g., deep trench 124) and damaged regions (e.g., damaged implant region 122). When potential 128 is applied to device layer 106, regions underneath NFETs 116 and 118 are subject to depletion. As illustrated in FIG. 1A, depletion region 108 is formed in bulk semiconductor layer 102. Potential swings in device layer 106 can modulate the depth of depletion region 108 in bulk semiconductor layer 102, such that depletion region 108 can act as a dielectric medium to form one or more voltage-dependent, non-linear capacitors, or parasitic varactors. These parasitic varactors worsen the non-linearity in signals propagating through device layer 106.

Figure 1B:
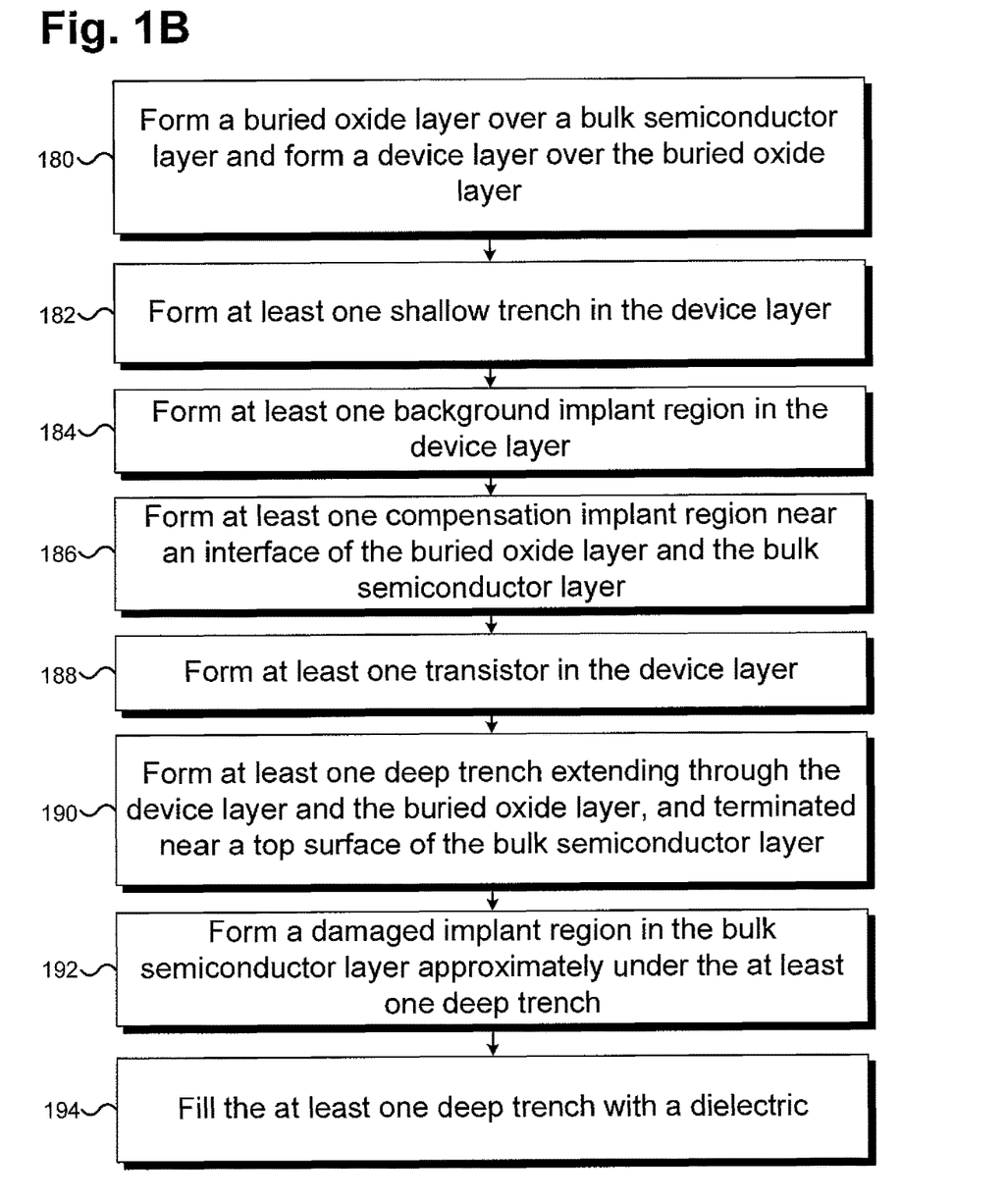
FIG. 1B is a flowchart illustrating a method for fabricating an exemplary SOI structure according to one implementation of the present application.

FIG. 1B shows a flowchart illustrating an exemplary method of forming an exemplary SOI structure according to an implementation of the present application. Certain details and features have been left out of the flowchart that are apparent to a person of ordinary skill in the art. For example, an action may consist of one or more subactions or may involve specialized equipment or materials, as known in the art. Actions 180, 182, 184, 186, 188, 190, 192 and 194 indicated in the flowchart are sufficient to describe one implementation of the present inventive concepts, other implementations of the present inventive concepts may utilize actions different from those shown in the flowchart. Moreover, structures 280, 282, 284, 286, 288, 290, 292 and 294 in FIGS. 2A, 2B, 2C, 2D, 2E, 2F, 2G and 2H illustrate the results of performing actions 180, 182, 184, 186, 188, 190, 192 and 194 of the flowchart, respectively. For example, structure 280 is an exemplary structure of a portion of a SOI structure after processing action 180, structure 282 is an exemplary structure of a portion of a SOI structure after the processing of action 182, structure 284 is an exemplary structure of a portion of a SOI structure after the processing of action 184, and so forth.

Figure 2A:
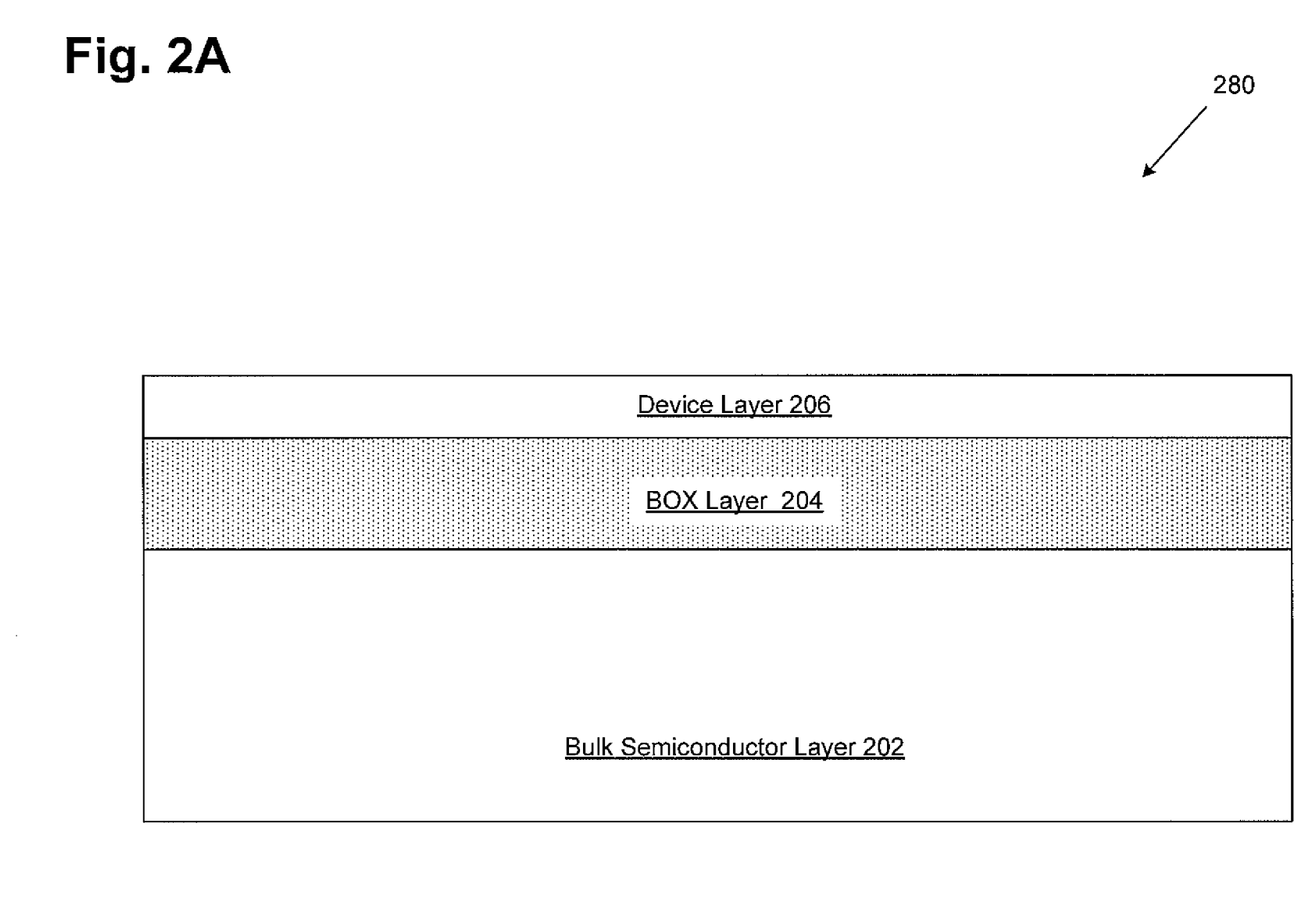
FIG. 2A illustrates a cross-sectional view of a portion of an exemplary SOI structure processed in accordance with an initial action in the flowchart of FIG. 1B according to one implementation of the present application.

Referring to action 180 in FIG. 1B and structure 280 in FIG. 2A, action 180 includes forming a buried oxide layer over a bulk semiconductor layer and forming a device layer over the buried oxide layer. As illustrated in FIG. 2A, structure 280 includes buried oxide ("BOX") layer 204 formed over bulk semiconductor layer 202, and device layer 206 formed over buried oxide layer 204. Structure 280, having bulk semiconductor layer 202, buried oxide layer 204 and device layer 206, can be formed by using any suitable methods. In one implementation, structure 280 may be formed by growing an oxide layer on a silicon wafer, growing an oxide layer on another silicon wafer, placing the oxide layers in contact with each other, annealing the oxide layers together, and grinding a reverse side of one of the silicon wafers to produce a SOI wafer having a device layer with a desired thickness. In another implementation, structure 280 may be formed by growing an oxide layer on a silicon wafer, growing an oxide layer on another silicon wafer, implanting hydrogen, placing the two silicon wafers together, and thermally shocking the resulting assembly to produce a SOI wafer having a device layer with a desired thickness. In yet another implementation, structure 280 may be formed by growing buried oxide layer on a bulk semiconductor layer and depositing a device layer on the buried oxide layer.

Figure 2B:
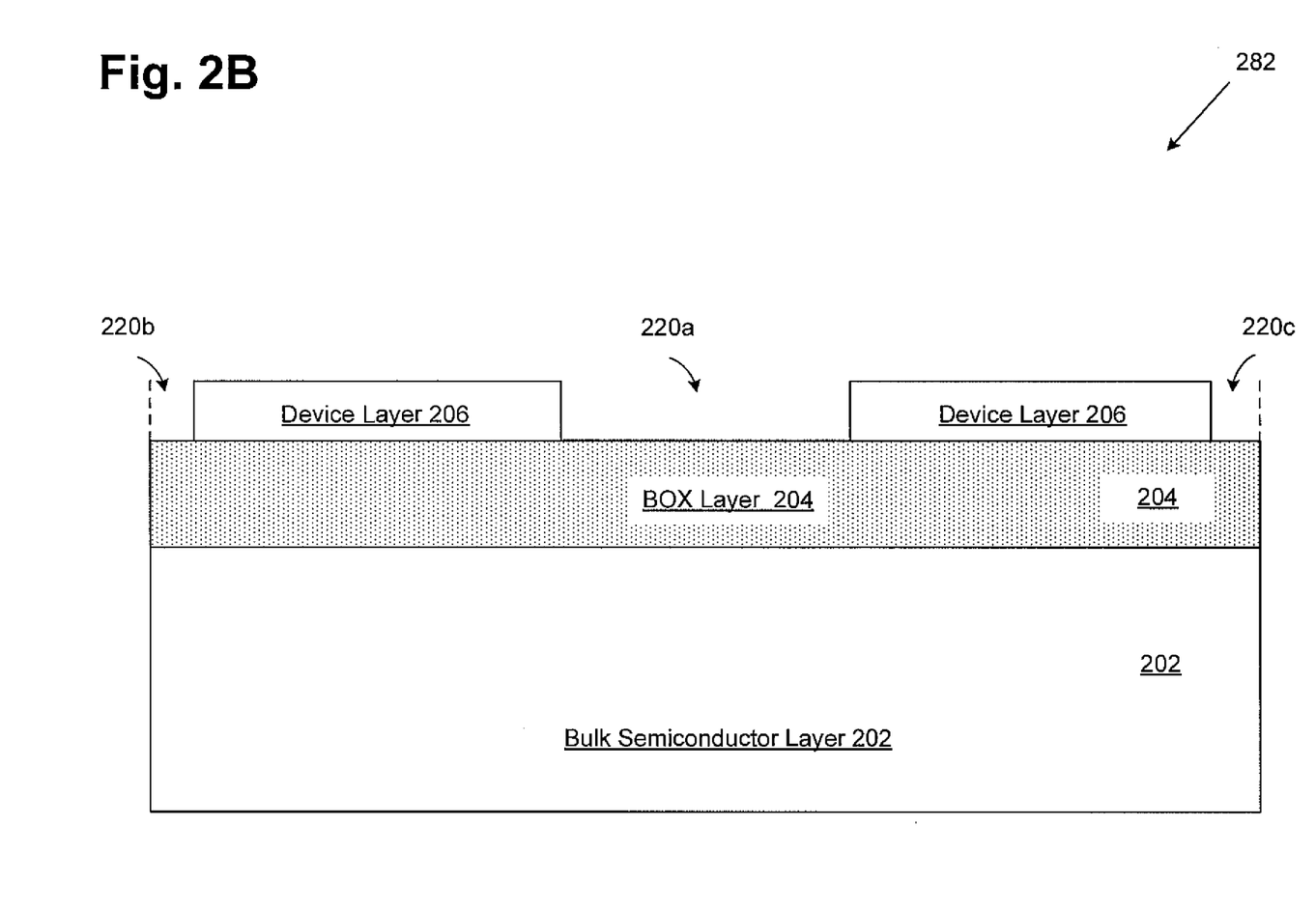
FIG. 2B illustrates a cross-sectional view of a portion of an exemplary SOI structure processed in accordance with an intermediate action in the flowchart of FIG. 1B according to one implementation of the present application.

Referring to action 182 in FIG. 1B and structure 282 in FIG. 2B, action 182 includes forming at least one shallow trench in the device layer. As illustrated in FIG. 2B, structure 282 includes shallow trenches 220a, 220b and 220c formed in device layer 206. As illustrated in FIG. 2B, shallow trenches 220a, 220b and 220c extend through device layer 206 and terminate on or near a top surface of buried oxide layer 204. Shallow trenches 220a, 220b and 220c are configured to electrically isolate semiconductor devices subsequently formed in device layer 206. For example, shallow trenches 220a, 220b and 220c can be formed by removing (e.g., etching away) portions of device layer 206 as shown in FIG. 2B.

Figure 2C:
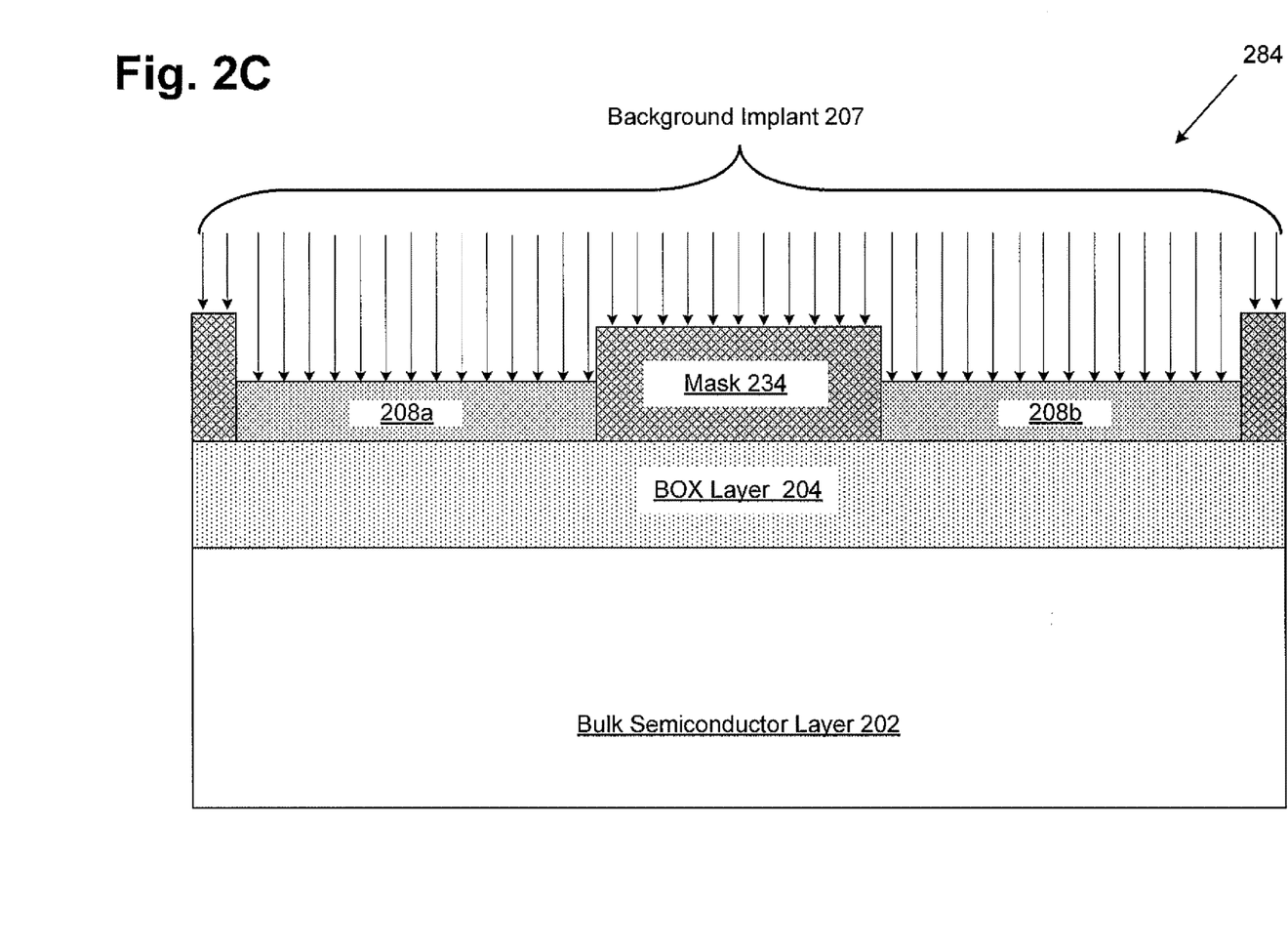
FIG. 2C illustrates a cross-sectional view of a portion of an exemplary SOI structure processed in accordance with an intermediate action in the flowchart of FIG. 1B according to one implementation of the present application.

Referring to action 184 in FIG. 1B and structure 284 in FIG. 2C, action 184 includes forming at least one background implant region in the device layer. As illustrated in FIG. 2C, structure 284 includes background implant regions 208a and 208b formed in device layer 206. In structure 284, mask 234 is formed and patterned in shallow trenches 220a, 220b and 220c. Thereafter, background implant 207 is implanted in device layer 206 to set the background doping levels for semiconductor devices to be subsequently formed therein. For N-type semiconductor devices, background implant 207 may include P-type implant, such as boron implant or the like, to form background implant regions 208a and 208b. For P-type semiconductor devices, background implant 207 may include N-type implant, such as phosphorus implant or the like, to form background implant regions 208a and 208b. As illustrated in FIG. 2C, background implant 207 is substantially uniformly implanted across background implant regions 208a and 208b. In the present implementation, background implant 207 is a low energy implant, and may be applied at an implant energy of 15 KeV, for example. In other implementations, background implant 207 may be applied at an implant energy greater than or less than 15 KeV to suit the specific needs of a particular application.

Figure 2D:
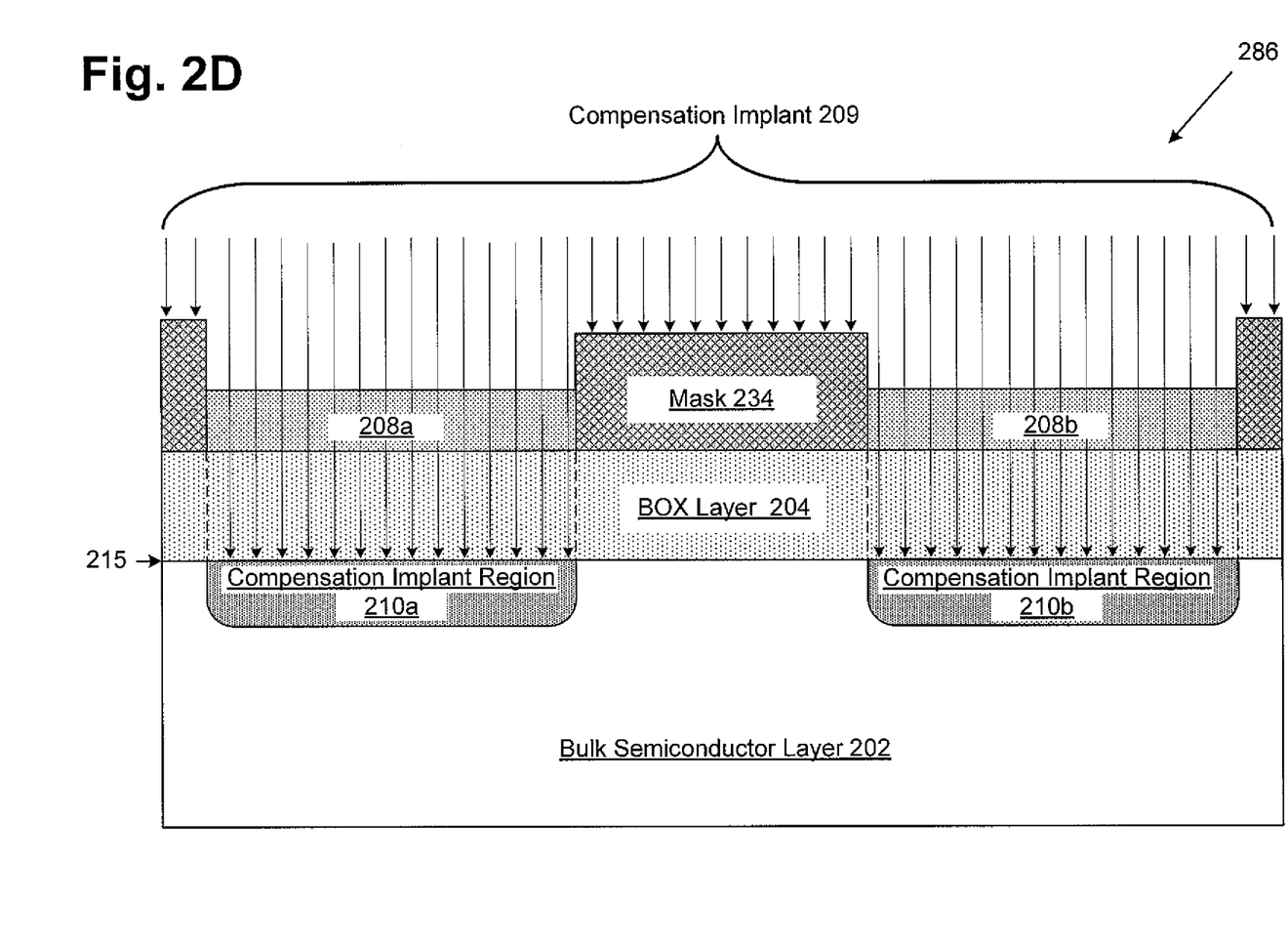
FIG. 2D illustrates a cross-sectional view of a portion of an exemplary SOI structure processed in accordance with an intermediate action in the flowchart of FIG. 1B according to one implementation of the present application.

Referring to action 186 in FIG. 1B and structure 286 in FIG. 2D, action 186 includes forming at least one compensation implant region near an interface of the buried oxide layer and the bulk semiconductor layer. As illustrated in FIG. 2D, structure 286 includes compensation implant regions 210a and 210b formed near an interface of buried oxide layer 204 and bulk semiconductor layer 202. It is noted that mask 234, that was used during the formation of background implant regions 208a and 208b, is still in place and used again for the formation of compensation implant regions 210a and 210b, thereby saving manufacturing cost.

In the present implementation, compensation implant 209 is a high-energy implant, and may be applied at an implant energy of 400 KeV, for example. In other implementations, compensation implant 209 may be applied at an implant energy greater than or less than 400 KeV to suit the specific needs of a particular application. It is noted that the energy level for implanting compensation implant 209, such as high energy boron dopant, is significantly higher than the energy level for implanting background implant 207 to penetrate through device layer 206 and buried oxide layer 204 to reach near interface 215. As illustrated in FIG. 2D, compensation implant 209 is substantially uniformly implanted across compensation implant regions 210a and 210b. For N-type semiconductor devices over a P-type bulk semiconductor layer, compensation implant 209 may include P-type implant, such as boron implant or the like, to form compensation implant regions 210a and 210b. For P-type semiconductor devices over an N-type bulk semiconductor layer, compensation implant 209 includes N-type implant, such as phosphorus implant or the like, to form compensation implant regions 210a and 210b.

In the present implementation, bulk semiconductor layer 202 may have a doping concentration on the order of $e^{13}$ atoms/cm$^3$, which corresponds to a resistivity on the order of 1000 ohm-cm. By contrast, compensation implant regions 210a and 210b may have a doping concentration of at least one order of magnitude higher (e.g., $e^{14}$ atoms/cm$^3$) than the doping concentration of bulk semiconductor layer 202. In the present implementation, compensation implant regions 210a and 210b may have a doping concentration on the order of $e^{16}$ atoms/cm$^3$. Compensation implant regions 210a and 210b substantially eliminate a parasitic conduction layer under buried oxide layer 204. Also, compensation implant regions 210a and 210b make bulk semiconductor layer 202 insensitive to any voltage potential present in device layer 206.

Without the presence of compensation implant regions 210a and 210b, an inversion layer would have been resulted due to the fixed charge near the bottom surface of buried oxide layer 204, which would lead to parasitic conduction near the interface between buried oxide layer 204 and bulk semiconductor layer 202. It is noted that compensation implant regions 210a and 210b can be relatively lightly doped and still overwhelm the surface charge to substantially eliminate the parasitic conduction layer and depletion regions in bulk semiconductor layer 202. It is noted that compensation implant doses in the range of $5*e^{11}$/cm$^2$ are usually sufficient to prevent handle wafer inversion. Also, the compensation implant doses should be as low as possible to avoid compromising the high resistivity of bulk semiconductor layer 202.

Figure 2E:
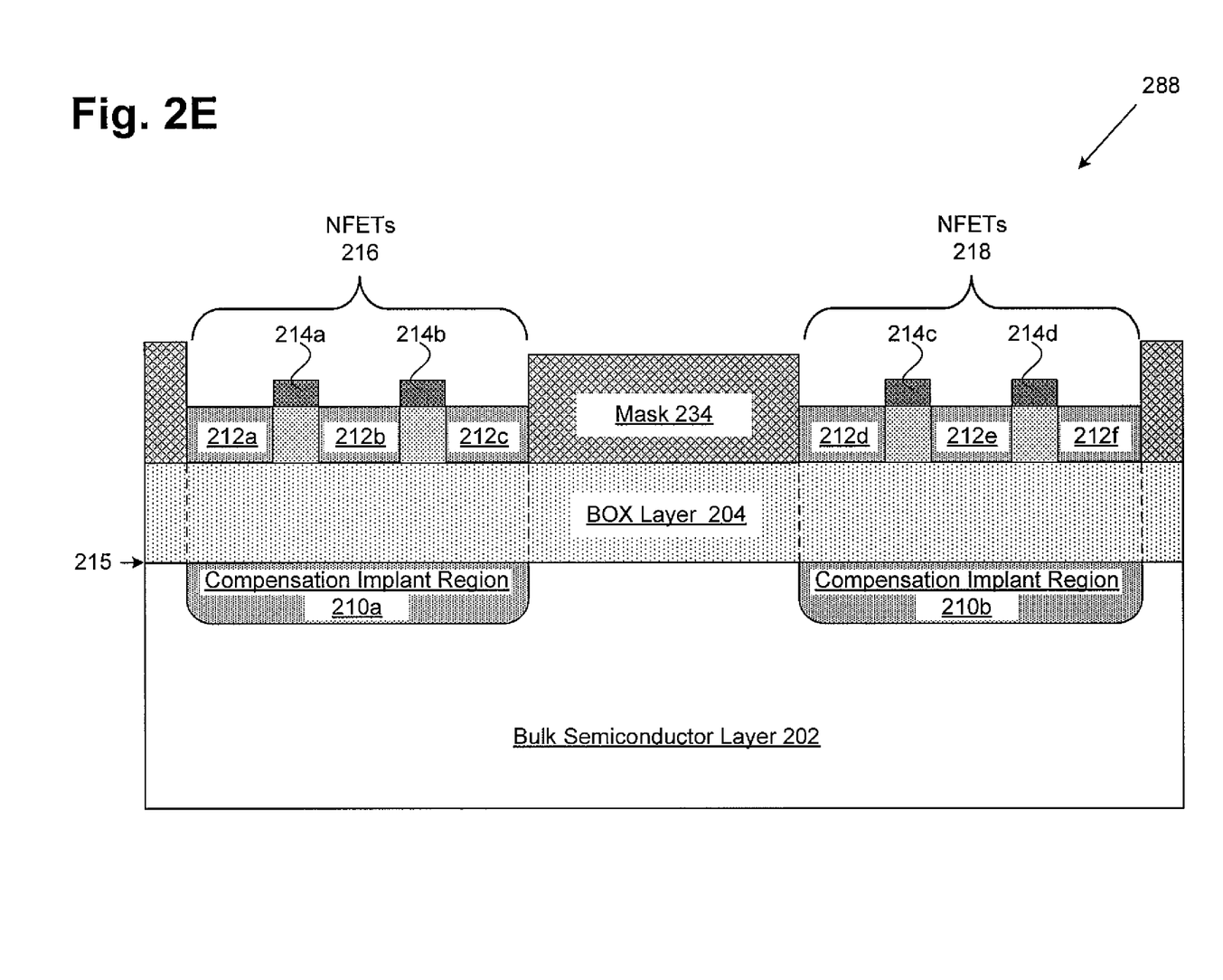
FIG. 2E illustrates a cross-sectional view of a portion of an exemplary SOI structure processed in accordance with an intermediate action in the flowchart of FIG. 1B according to one implementation of the present application.

Referring to action 188 in FIG. 1B and structure 288 in FIG. 2E, action 188 includes forming at least one transistor in the device layer. As illustrated in FIG. 2E, structure 288 includes semiconductor devices, such as NFETs 216 and 218, formed in device layer 206. As shown in FIG. 2E, source/drain regions 212a, 212b, 212c, 212d, 212e and 212f and gate structures 214a, 214b, 214c and 214d are formed, for example, using standard methods, including, but not limited to, well creation, active formation, gate formation, polysilicon processing, lightly doped drain processing, spacers for MOS transistors, source and drain implanting, contact formation, and any other actions necessary to fabricate transistors or other semiconductor devices. It is noted that compensation implant regions 210a and 210b are formed before source/drain regions 212a, 212b, 212c, 212d, 212e and 212f, and before a gate oxide of one or more gate structures 214a, 214b, 214c and 214d. As such, a high temperature budget used to activate the source and drain dopants in source/drain regions 212a, 212b, 212c, 212d, 212e and 212f is also sufficient to activate dopants in compensation implant regions 210a and 210b during the same process, thereby saving manufacturing cost. It is also noted that mask 234 is utilized again during the formation of NFETs 216 and 218. Thus, the triple use of mask 234 also saves manufacturing cost.

Figure 2F:
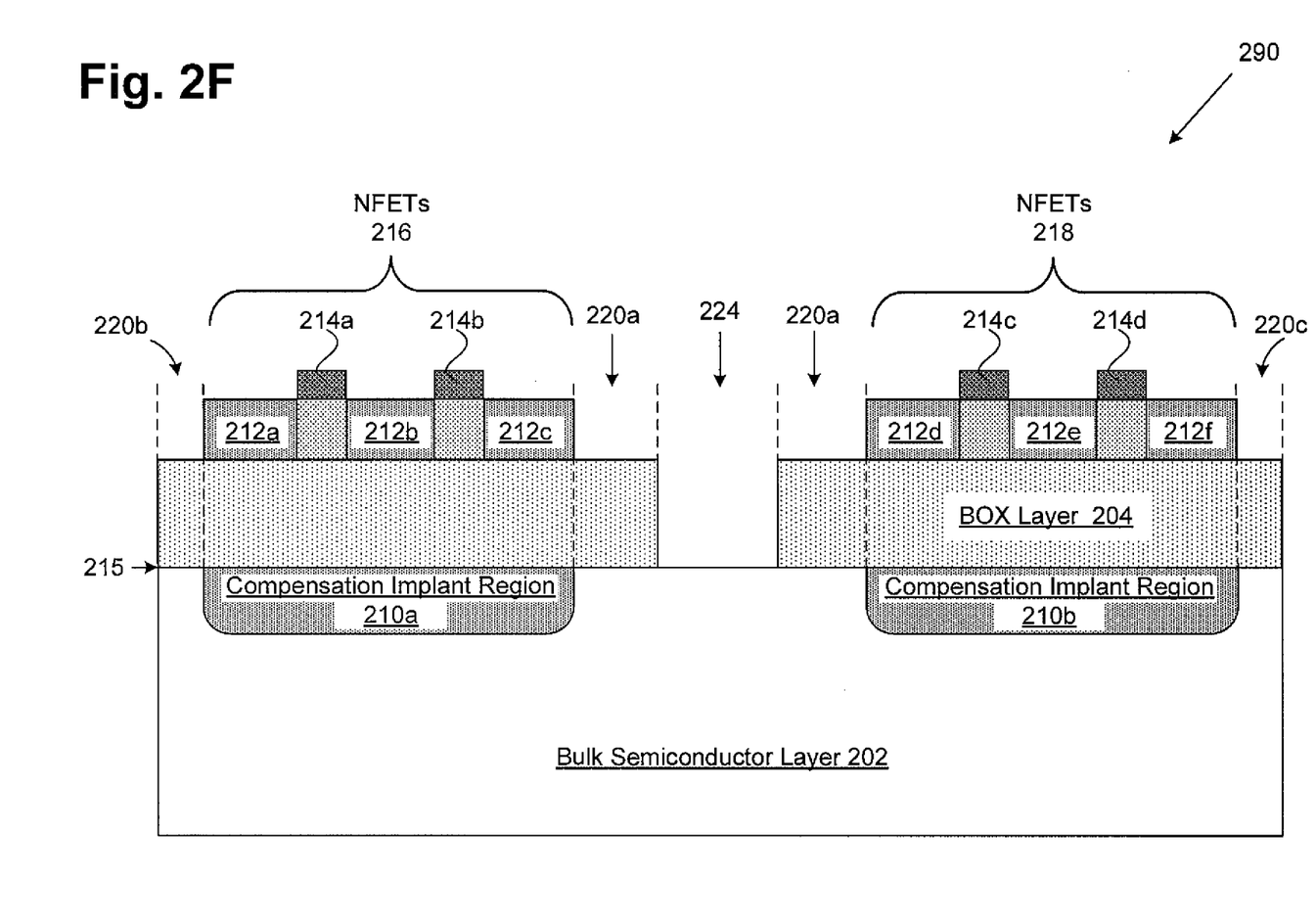
FIG. 2F illustrates a cross-sectional view of a portion of an exemplary SOI structure processed in accordance with an intermediate action in the flowchart of FIG. 1B according to one implementation of the present application.

Referring to action 190 in FIG. 1B and structure 290 in FIG. 2F, action 190 includes forming at least one deep trench extending through the device layer and the buried oxide layer, and terminated near a top surface of the bulk semiconductor layer. As illustrated in FIG. 2F, structure 290 includes deep trench 224 extending through device layer 206 and buried oxide layer 204, and terminated near a top surface of bulk semiconductor layer 202. As illustrated in FIG. 2F, deep trench 224 is configured to provide further electrical isolation between semiconductor devices, such as NFETs 216 and 218, in device layer 206. For example, deep trench 224 can be formed by removing (e.g., etching away) portions of buried oxide layer 204 as shown in FIG. 2F. For example, a deep trench mask (not explicitly shown in FIG. 2F) can be used to mask NFETs 216 and 218 and shallow trenches 220a, 220b and 220c. Also, a protective barrier layer and disposable oxide (not explicitly shown in FIG. 2F) may be deposited over NEFTs 216 and 218 and shallow trenches 220a, 220b and 220c before the deep trench mask is deposited. The protective barrier layer may include, for example, an oxide barrier layer or a nitride barrier layer. The disposable oxide (not explicitly shown in FIG. 2F) is deposited on top of the protective barrier layer.

It is noted that, before the formation of deep trench 224, it is important for NFETs 216 and 218 in device layer to have already received their doping implants (e.g., source and drain implants) and annealing treatments to activate those dopants to avoid subjecting a subsequently formed damaged region under deep trench 224 to high thermal budgets. Thus, high temperature cycles, such as anneal, are done before the formation of deep trench 224. It is noted that the high temperature budget used to activate the source and drain dopants in device layer 206 is also sufficient to activate dopants in compensation implant regions 210a and 210b during the same process. Thus, it is important that compensation implant regions 210a and 210b are formed before source/drain regions 212a, 212b, 212c, 212d, 212e and 212f are formed in device layer 206.

Figure 2G:
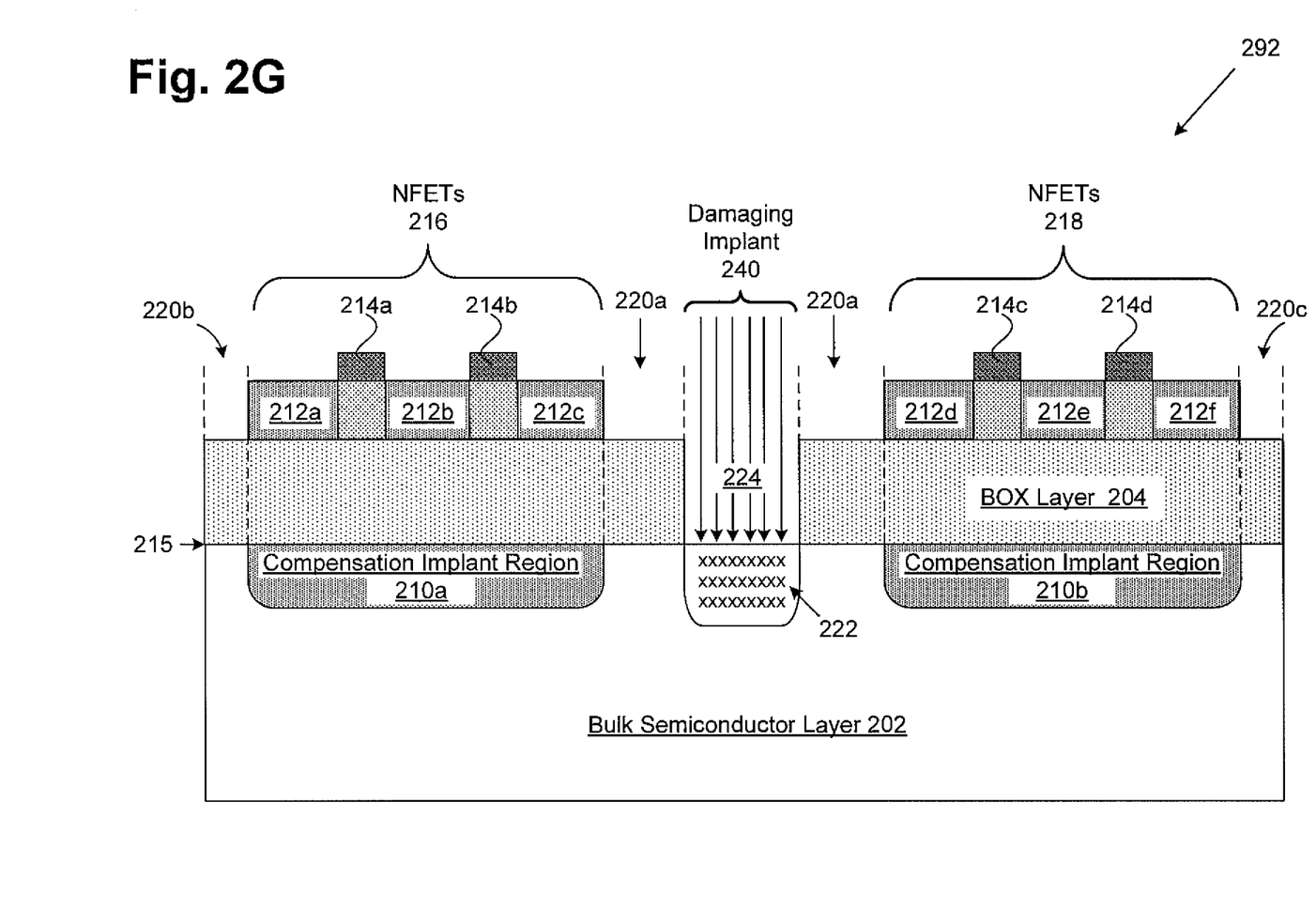
FIG. 2G illustrates a cross-sectional view of a portion of an exemplary SOI structure processed in accordance with an intermediate action in the flowchart of FIG. 1B according to one implementation of the present application.

Referring to action 192 in FIG. 1B and structure 292 in FIG. 2G, action 192 includes forming a damaged implant region in the bulk semiconductor layer approximately under the deep trench. As illustrated in FIG. 2G, structure 292 includes damaged implant region 222 formed in bulk semiconductor layer 202 approximately under deep trench 224. As illustrated in FIG. 2G, damaging implant 240, such as an amorphizing inert implant, is applied to damage bulk semiconductor layer 202 under deep trench 224. Damaging implant 240 may include a heavy element such as Argon or Xenon, and may be applied at an implant energy of 50 KeV, for example. However, the implant energy may be greater than or less than 50 KeV to suit the specific needs of a particular application.

As illustrated in FIG. 2G, compensation implant regions 210a and 210b are outside of damaged implant region 222. Also, damaged implant region 222 extends into bulk semiconductor layer 202 at a greater depth than compensation implant regions 210a and 210b do. In other implications, damaged implant region 222 may extend to the same depth into bulk semiconductor layer 202 as compensation implant regions 210a and 210b. Damaged implant region 222 may contain a high density of carrier traps that significantly reduce the mobility of carriers in damaged implant region 222, as compared to undamaged portions of bulk semiconductor layer 202. The carrier traps significantly reduce carrier mobility in damaged implant region 222, making damaged implant region 222 insensitive to any voltage potential present in device layer 206. Thus, damaged implant region 222 provides electrical isolation and improves linearity between adjacent semiconductor devices (e.g., NFETs 216 and 218) situated in device layer 206.

Figure 2H:
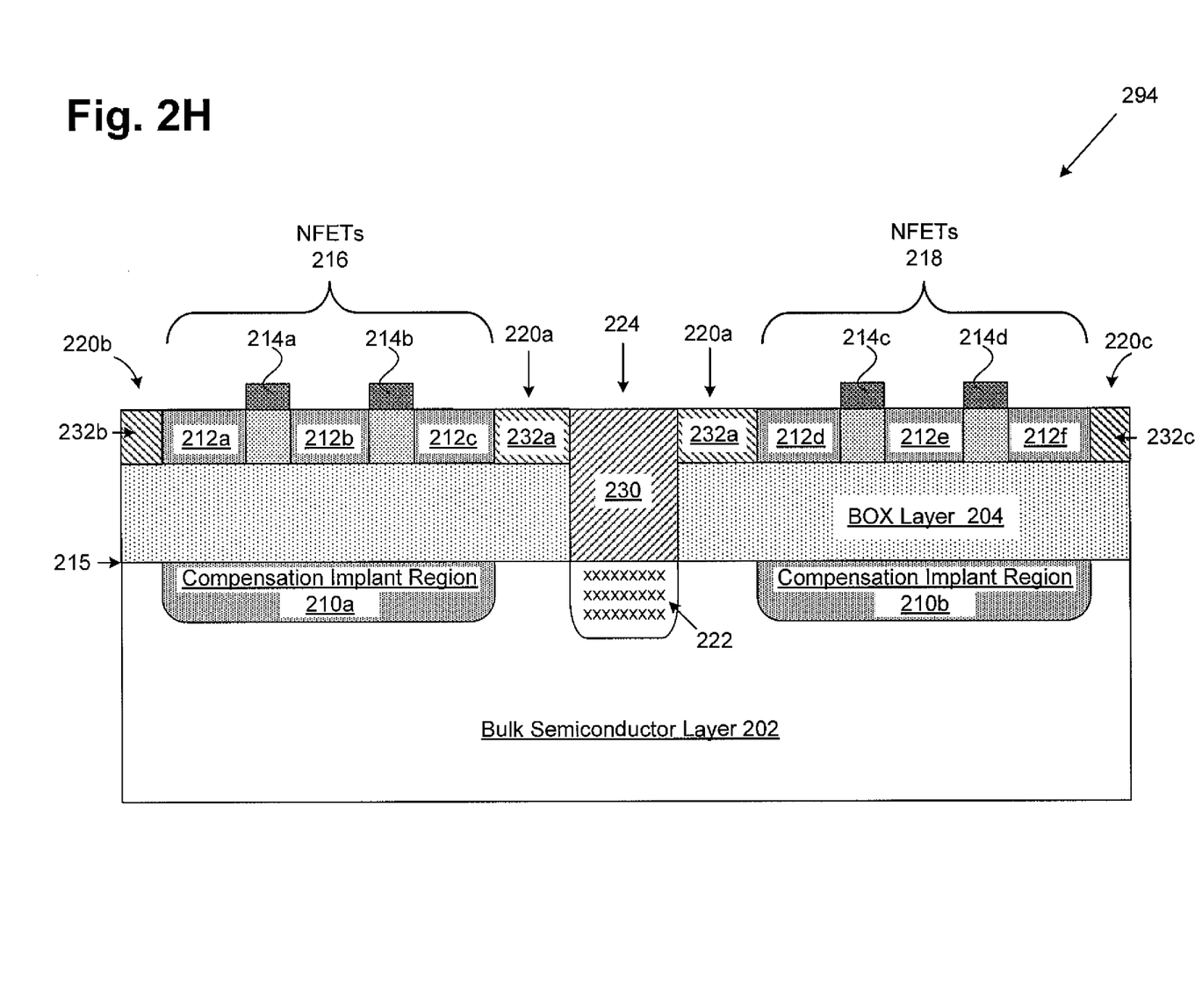
FIG. 2H illustrates a cross-sectional view of a portion of an exemplary SOI structure processed in accordance with a final action in the flowchart of FIG. 1B according to one implementation of the present application.

Referring to action 194 in FIG. 1B and structure 294 in FIG. 2H, action 194 includes filling the at least one deep trench with a dielectric. As illustrated in FIG. 2H, structure 294 includes dielectric 230 filling deep trench 224 and extending through device layer 206 and buried oxide layer 204. Dielectric 230 in deep trench 224 may include, but not limited to, borophosphosilicate (BPSE) and other types of doped glasses. Also, as shown in FIG. 2H, shallow trenches 220a, 220b and 220c are filled with dielectrics 232a, 232b and 232c, respectively. In one implementation, dielectrics 232a, 232b and 232c may include substantially the same material as dielectric 230. In other implementations, dielectrics 232a, 232b and 232c may include material different from dielectric 230. Dielectric 230 together with dielectrics 232a, 232b and 232c improve electrical isolation between semiconductor devices, such as NFETs 216 and 218, in device layer 206.

Implementations of the present application utilize buried oxide layer removal and damage techniques in combination with a relatively low dose compensation implant (e.g., a P-type compensation implant into a P-type bulk semiconductor layer, or an N-type type compensation implant into an N-type bulk semiconductor layer) where the doping compensation implant is performed outside of regions affected by the damage implant. The compensation implant regions compensate the charge in the parasitic conduction layer and prevent the region under the semiconductor devices from inversion in response to changes in the device layer potential. In one implementation, the peak of the compensation implant doping profile can reside near the buried oxide layer and bulk semiconductor layer interface. The compensation implant can be done early in process (e.g., before gate oxidation) without significantly perturbing the surface devices. The high resistivity of the bulk semiconductor layer around the compensation implant regions (i.e., in series with it) help ensure the net handle wafer parasitic network present a high impedance to the surface devices. Implementations of the present application help improve linearity performance in RF-SOI circuits such as RF switches by greatly reducing the voltage sensitivity of the parasitic varactors under the surface devices. The specific advantages of improved linearity will depend on the product, but generally will result in less spectral interference. For example, modern cell phone front-end modules require very linear RF switches to enable more efficient use of the available cellular spectrum.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A structure comprising:
   a buried oxide layer over a bulk semiconductor layer;
   a device layer over said buried oxide layer;
   a compensation implant region near an interface of said buried oxide layer and said bulk semiconductor layer;
   wherein said compensation implant region is configured to substantially eliminate a parasitic conduction layer near said buried oxide layer;
   a deep trench extending through said device layer and said buried oxide layer, wherein said deep trench is filled with a dielectric material; and
   a damaged implant region in said bulk semiconductor layer under said deep trench, wherein said damaged implant region is separated from said compensation implant region in said bulk semiconductor layer.

2. The structure of claim 1 wherein said deep trench terminates near a top surface of said bulk semiconductor layer.

3. The structure of claim 1 further comprising at least one shallow trench in said device layer, wherein said shallow trench is filled with a dielectric material.

4. The structure of claim 1 further comprising at least one transistor in said device layer.

5. The structure of claim 1 wherein said damaged implant region extends deeper into said bulk semiconductor layer than said compensation implant region.

6. The structure of claim 1 wherein said compensation implant region has a doping concentration of at least one order of magnitude higher than a doping concentration of said bulk semiconductor layer.

7. The structure of claim 1 wherein said compensation implant region includes a charge of a first conductivity type to compensate a charge of a second conductivity type in said parasitic conduction layer.

8. A method comprising:
   forming a buried oxide layer over a bulk semiconductor layer;

forming a device layer over said buried oxide layer;

performing a background implant into said device layer through a mask;

performing a compensation implant through the mask, thereby forming a compensation implant region near an interface of said buried oxide layer and said bulk semiconductor layer, wherein said compensation implant region is configured to substantially eliminate a parasitic conduction layer near said buried oxide layer; and then, performing a source/drain implant through the mask to form source and drain regions of at least one transistor in said device layer.

9. The method of claim 8 further comprising forming a deep trench extending through said device layer and said buried oxide layer.

10. The method of claim 9 further comprising forming a damaged implant region in said bulk semiconductor layer near said deep trench.

11. The method of claim 9 further comprising filling said deep trench with a dielectric material.

12. The method of claim 8 further comprising simultaneously activating dopants in said compensation implant region and said source and drain regions of said at least one transistor.

13. The method of claim 8 wherein said compensation implant is performed before a gate oxide of said at least one transistor is formed.

14. The method of claim 9 wherein said deep trench terminates near a top surface of said bulk semiconductor layer.

15. The method of claim 8 further comprising forming at least one shallow trench in said device layer.

16. The method of claim 10 wherein said compensation implant region is separate from said damaged implant region.

17. The method of claim 10 wherein said damaged implant region extends deeper into said bulk semiconductor layer than said compensation implant region.

* * * * *